United States Patent
Luo et al.

(10) Patent No.: US 7,682,755 B2
(45) Date of Patent: Mar. 23, 2010

(54) LITHOGRAPHY MASK AND OPTICAL LITHOGRAPHY METHOD USING SURFACE PLASMON

(75) Inventors: Xiangang Luo, Wako (JP); Teruya Ishihara, Wako (JP)

(73) Assignee: Riken, Wako-Shi, Saitama (JP)

( * ) Notice: Subject to any disclaimer, the term of this patent is extended or adjusted under 35 U.S.C. 154(b) by 1252 days.

(21) Appl. No.: 10/973,248

(22) Filed: Oct. 27, 2004

(65) Prior Publication Data

US 2005/0233262 A1    Oct. 20, 2005

(30) Foreign Application Priority Data

Apr. 16, 2004   (JP) .............................. 2004-122221

(51) Int. Cl.
*G03F 1/00*    (2006.01)
(52) U.S. Cl. .......................................... 430/5; 430/313
(58) Field of Classification Search ...................... 430/5, 430/313; 250/216; 355/19, 53; 356/400
See application file for complete search history.

(56) References Cited

U.S. PATENT DOCUMENTS

| | | | |
|---|---|---|---|
| 6,236,033 B1 * | 5/2001 | Ebbesen et al. ............. 250/216 |
| 6,238,826 B1 * | 5/2001 | Ruf ................................ 430/5 |
| 2003/0129545 A1 * | 7/2003 | Kik et al. ..................... 430/313 |
| 2004/0067422 A1 * | 4/2004 | Park et al. ....................... 430/5 |
| 2004/0080732 A1 * | 4/2004 | Kuroda et al. ................. 355/53 |
| 2005/0064303 A1 * | 3/2005 | Yamada et al. ................. 430/5 |

* cited by examiner

*Primary Examiner*—Mark F Huff
*Assistant Examiner*—Stewart A Fraser
(74) *Attorney, Agent, or Firm*—Birch, Stewart, Kolasch & Birch, LLP (57) ABSTRACT

A periodic structure for producing surface plasmon resonance as a result of coupling surface plasmon with light is formed on a side to which the light is to be input, while a fine structure having a periodically or aperiodically arbitrary shape is formed opposite to the periodic structure in order that a pattern a dimension of which is a half or less than a wavelength of light can be transferred to a resist without requiring closely contact of the resist with a mask, or an exposure for a long period of time unlike near field lithography. An electric field transmission layer may be formed between the periodic structure and the fine structure, and the fine structure may be formed on the electric field transmission layer.

29 Claims, 7 Drawing Sheets

ELECTRIC FIELD STRENGTH CALCULATED
IN ACCORDANCE WITH FDTD METHOD

FIG. 5

FIG. 7

LITHOGRAPHY MASK AND OPTICAL LITHOGRAPHY METHOD USING SURFACE PLASMON

BACKGROUND OF THE INVENTION

1. Field of the Invention

The present invention relates to a lithography mask and an optical lithography method using surface plasmon, and more particularly to a lithography mask and an optical lithography method using surface plasmon suitable for applying in the case where a fine pattern a length of which is shorter than that of light wavelength, for example, a fine pattern of nanometer order is transferred onto a resist.

2. Description of the Related Art

It is known that a well-known optical lithography which has heretofore been known involves such a problem that when the minimum dimension of an opening in a lithography mask which was formed into a desired pattern with openings becomes a half or less than a wavelength of light to be applied, the light is diffracted, so that the pattern of the lithography mask cannot be correctly transferred to a resist.

As a means for solving such well-known problem in optical lithography, for example, near field lithography is known.

In the near field lithography, a lithography mask is disposed in closely contact with a resist, and an evanescent field appeared in an opening, a dimension of which is smaller than that of a wavelength of light, is used for sensitizing the resist, openings being formed as a pattern on the lithography mask. However, the near field lithography involves such a problem that electric field strength of near field light oozed from the openings is small so that an exposure time of the resist becomes long in addition to such a problem that an adjustment for closely contact alignment of the resist and the mask is difficult.

It is to be noted that the prior art which has been known by the present applicant at the time of filing this application is that as described above, so that there is no prior art information to be described herein.

OBJECT AND SUMMARY OF THE INVENTION

The present invention has been made in view of the problems involved in the conventional technology as described above, and an object of the invention is to provide a lithography mask and an optical lithography method using surface plasmon by which a pattern having a dimension smaller than a half or less of a wavelength of light can be transferred to a resist without requiring closely contact of the resist with the mask, and an exposure for a long period of time unlike near field lithography method.

For the sake of achieving the above-described object, the present invention is adapted to separate intake of light, propagation of light, and a design for a near field in an optical lithography for forming a fine pattern a dimension of which is a half or less of a wavelength of light.

Namely, a lithography mask according to the present invention comprises a periodic structure for producing surface plasmon resonance by coupling surface plasmon with light, the periodic structure being formed on an input side of the light; and a fine structure having a periodically or aperiodically arbitrary shape, the fine structure being formed opposite to the periodic structure.

Furthermore, a total thickness of the periodic structure and the fine structure is about 15 nm in the lithography mask according to the present invention.

Moreover, the periodic structure and the fine structure are made from a conductive material in the lithography mask according to the present invention.

Further, an electric field transmission layer is formed between the periodic structure and the fine structure, and the fine structure is formed on the electric field transmission layer in the lithography mask according to the present invention.

Still further, a total thickness of the periodic structure, the electric field transmission layer, and the fine structure is about 15 nm in the lithography mask according to the present invention.

Yet further, the periodic structure, the electric field transmission layer, and the fine structure is made from a conductive material in the lithography mask according to the present invention.

Furthermore, the fine structure is composed of fine protrusions or fine recesses each having a predetermined shape in the lithography mask according to the present invention.

Moreover, the fine protrusion or the fine recess has a columnar, a hemispherical, or a rectangularly columnar shape in the lithography mask according to the present invention.

Further, the fine protrusion or the fine recess has a needle-like shape the extreme end of which is sharpened in the lithography mask according to the present invention.

Still further, an optical lithography method using surface plasmon according to the present invention comprises the steps of inputting light to the periodic structure in the lithography mask of the present invention; photosensitizing a resist with near field light a strength of which is intensified by surface plasmon resonance oozed from the fine structure; and transferring a pattern corresponding to the fine structure to the resist.

Thus, according to the present invention, such an excellent advantage that a pattern having a dimension being a half or less of a wavelength of light can be transferred to a resist, and in this case the resist is not required to be closely in contact with a mask, and an exposure for a long period of time is not required unlike near field lithography is obtained.

Accordingly, the present invention is applicable for a lithography technology utilized for manufacturing integrated circuits and the like.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

An example of a preferred embodiment of a lithography mask and an optical lithography method using surface plasmon will be fully described by referring to the accompanying drawings.

Figure 1:
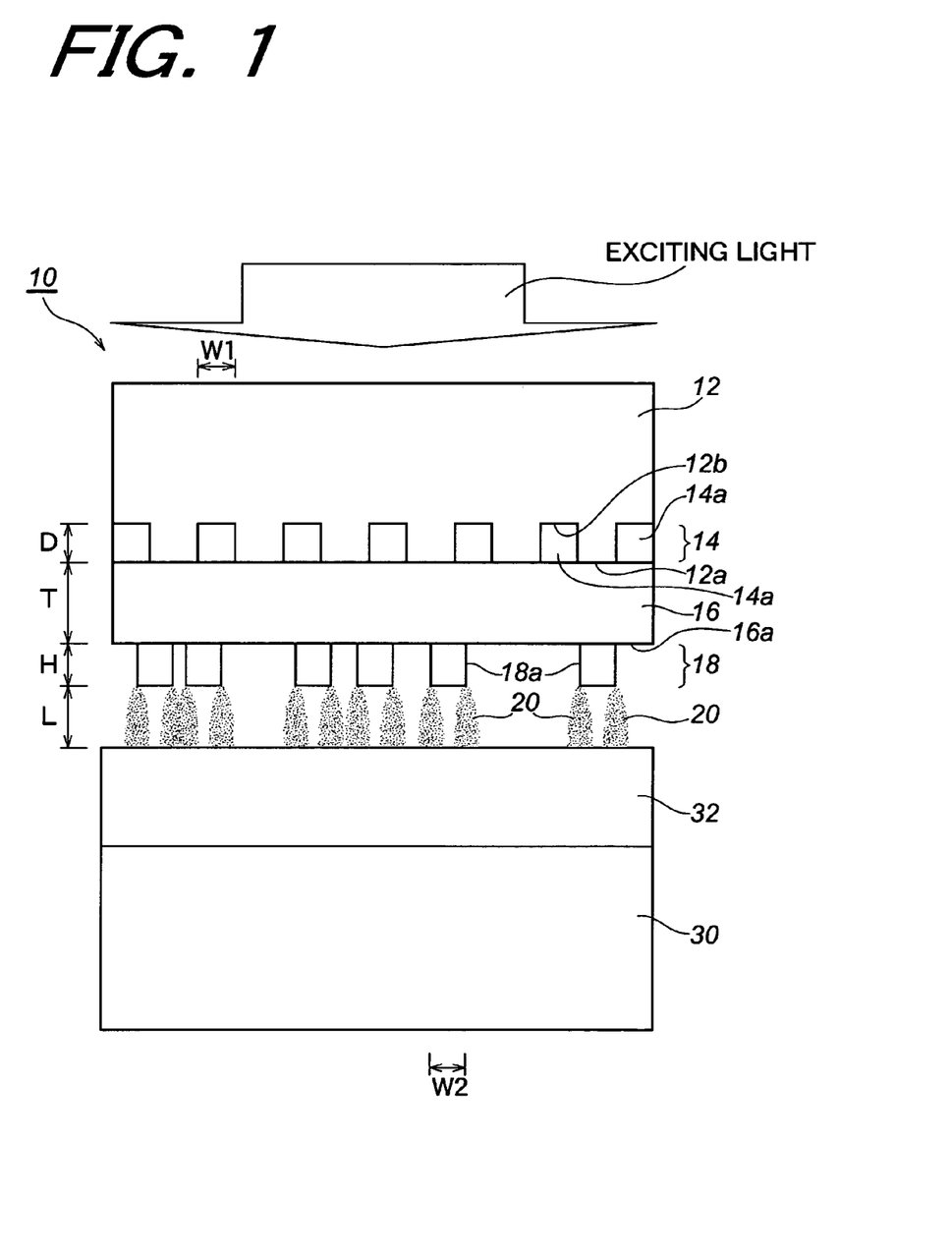
FIG. 1 is a conceptual, constitutive explanatory view illustrating an example of a preferred embodiment of a lithography mask according to the present invention.

FIG. 1 is a conceptual, constitutive explanatory view illustrating an example of a preferred embodiment of a lithography mask according to the present invention.

Namely, the lithography mask 10 is composed of a substrate 12 made from a material transparent to light (exciting light) input to the lithography mask 10, a periodic structure 14 formed on the substrate 12, an electric field transmission layer 16 formed with respect to the periodic structure 14, and a fine structure 18 with respect to the electric field transmission layer 16. The fine structure 18 is formed into an appropriate periodic or aperiodic shape, whereby a desired pattern to be transferred to a resist, which will be described hereinafter, is obtained.

Reference numeral 20 designates near field light oozed from the fine structure 18, reference numeral 30 designates a substrate for fabricating a pattern structure formed into the fine structure 18, and reference numeral 32 designates a resist applied on the substrate 30. The pattern formed into the fine structure 18 is transferred to the resist 32.

The periodic structure 14 is constituted by such a manner that recesses 12b are defined periodically on a side 12a opposite to the side of the substrate 12 to which exciting light is to be input, and each inside of the recesses 12b is filled with a small piece 14a for making a periodic structure. In the preferred embodiment, a spatial contour of the recess 12b has a quadratic prism shape, while each of the small pieces 14a for making the periodic structure is formed into a corresponding quadratic prism shape, so that the interior of the quadratic prism-shaped recess 12b is filled with the small piece 14a without accompanying any clearance.

Furthermore, the electric field transmission layer 16 is formed into a flat plate shape so as to cover the periodic structure formed on the side 12a of the substrate 12.

Moreover, the fine structure 18 is constructed by disposing fine protrusions 18a protruded from a surface 16a of the electric field transmission layer 16 to a side of the resist 32, whereby a desired periodic or aperiodic appropriate pattern may be formed by disposing properly the fine protrusions 18a. In the preferred embodiment, each of the fine protrusions 18a has a quadratic prism shape.

In addition, the substrate 12 is made from a material transparent to exciting light as described above, an example of which includes quartz glass, acrylic resin, $CaF_2$ or $MgF_2$ and the like.

On one hand, the small pieces 14a for making the periodic structure, the electric field transmission layer 16, and the fine protrusions 18a for composing the fine structure 18 are made from a conductive material, for example, a metal such as gold, and silver and the like.

It is possible to arbitrarily select each dimension of the lithography mask 10 in response to a wavelength of exciting light and a kind of a variety of materials. For instance, in the case where light having 436 nm wavelength is used as exciting light, quartz glass is used for the substrate 12, Ag is used for the small pieces 14a for making the periodic structure from which the periodic structure 14 is to be fabricated, Ag is used for the electric field transmission layer 16, and Ag is used for the fine protrusions 18a for composing the fine structure 18, for example, a depth D of the recess 12b may be set to be 20 to 100 nm, a thickness T of the electric field transmission layer may be set to be 20 to 60 nm, a height H of the fine protrusion 18a may be set to be 20 to 100 nm, a distance L of from the extreme end of the fine protrusion 18a to a surface of the resist 32 may be set to be 0 to 200 nm, a width W1 of the recess 12b may be set to be 20 to 380, and a width W2 of the fine protrusion 18a may be set to be 2 to 398 nm, respectively.

Besides, as a light source for exciting light, Hg-g line which has already been made to be practicable as a light source for optical lithography and the like lines may be applied. Further, a TMSR photoresist which has already been made to be practicable as a resist for optical lithography and the like photoresists may be applied to the resist 32.

In the above-described construction, when exciting light is irradiated on the lithography mask 10 described above, the exciting light is coupled with surface plasmon in the periodic structure 14 to produce surface plasmon resonance.

Due to production of the surface plasmon resonance, the near field light the electric field strength of which is intensified is oozed from the fine structure 18, the resist 32 is exposed to light by means of the near field light 20, so that a pattern corresponding to structures of the fine protrusions 18a in the fine structure 18 is transferred to the resist 32.

Accordingly, when optical lithography wherein the lithography mask 10 is used is applied, it becomes possible to transfer a pattern having a dimension smaller than that of a half or less of wavelength of light to the resist 32, and further, in this case, there is no need of closely contact of the resist with the mask, and of an exposure for a long period of time unlike in case of near field lithography. This is because a high spatial frequency derived from a large wave vector of surface plasmon is utilized.

The inventor of the present application will propose that an optical lithography method using surface plasmon according to the present invention which is an optical lithography in which the above-described lithography mask 10 is used is called by the name of "Surface Plasmon Resonance Interference Nanolithography Technique (SPRINT)".

Figure 2:
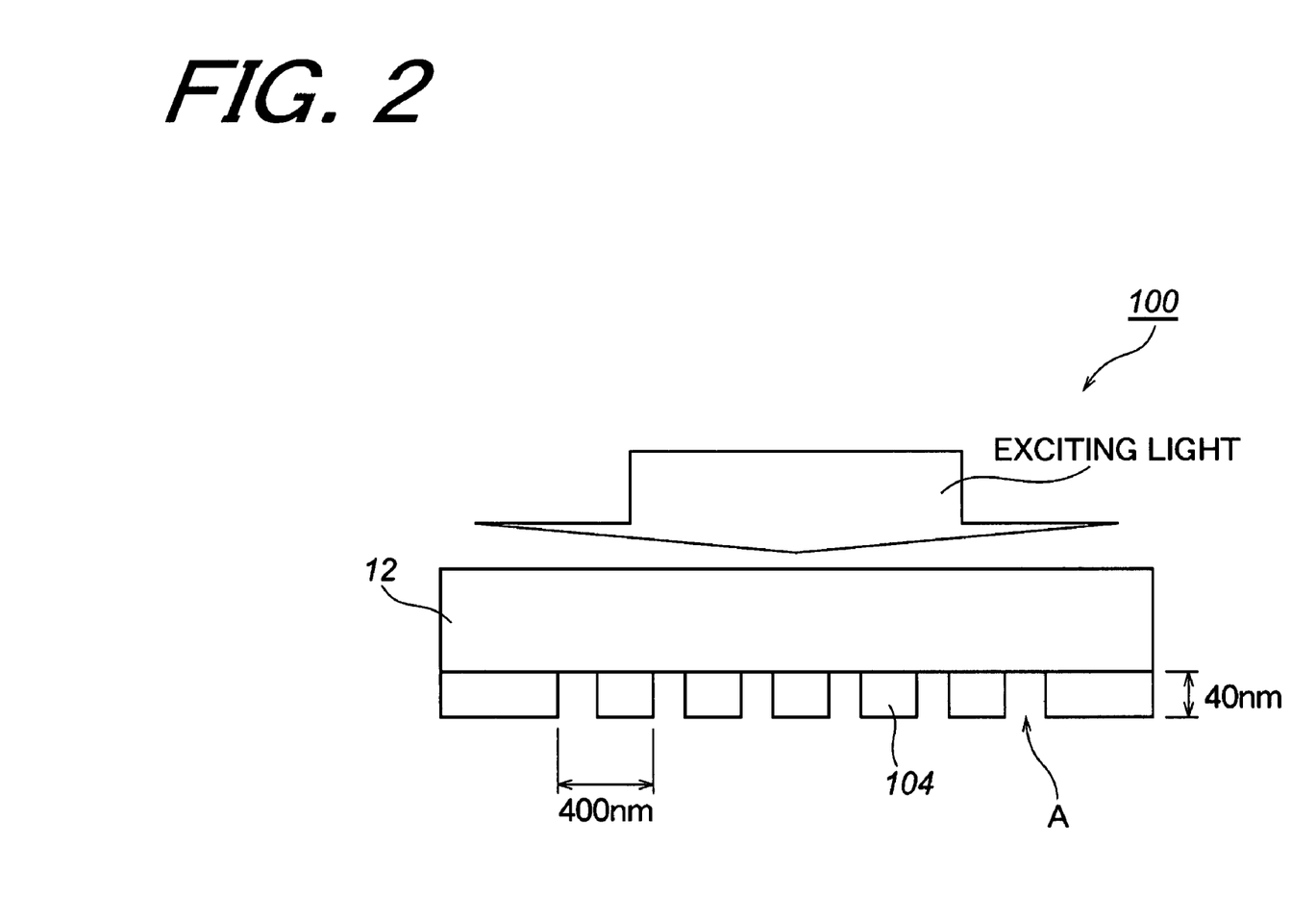
FIG. 2 is a conceptual, constitutive explanatory view illustrating a lithography mask according to the present invention which is used for an experiment conducted by the inventor of the present application.

Next, experimental results conducted by the inventor of the present application will be described. In the experiment, a lithography mask 100 provided with no electric field transmission layer 16, in other words, an electric field transmission layer 16 a thickness T of which is zero, a periodic structure 14, and a fine structure 18 wherein the periodic structure 14 has the same pattern as that of the fine structure 18 is used as a lithography mask according to the present invention.

More specifically, as shown in FIG. 2, the lithography mask 100 according to the present invention used in the experiment is obtained by fabricating a structure 104 composed of the periodic structure 14 and the fine structure 18 on a substrate 12 made of quartz glass wherein the structure 104 having 1:1 line and space configuration in a period of 400 nm is disposed on a gold thin film which is metallized with 40 nm thickness by electron beam lithography.

By employing a device for a well-known optical lithography, mercury g-line (436 nm wavelength) is irradiated as exciting light with respect to the lithography mask 100, whereby a TMSR photoresist is photosensitized.

Figure 3:
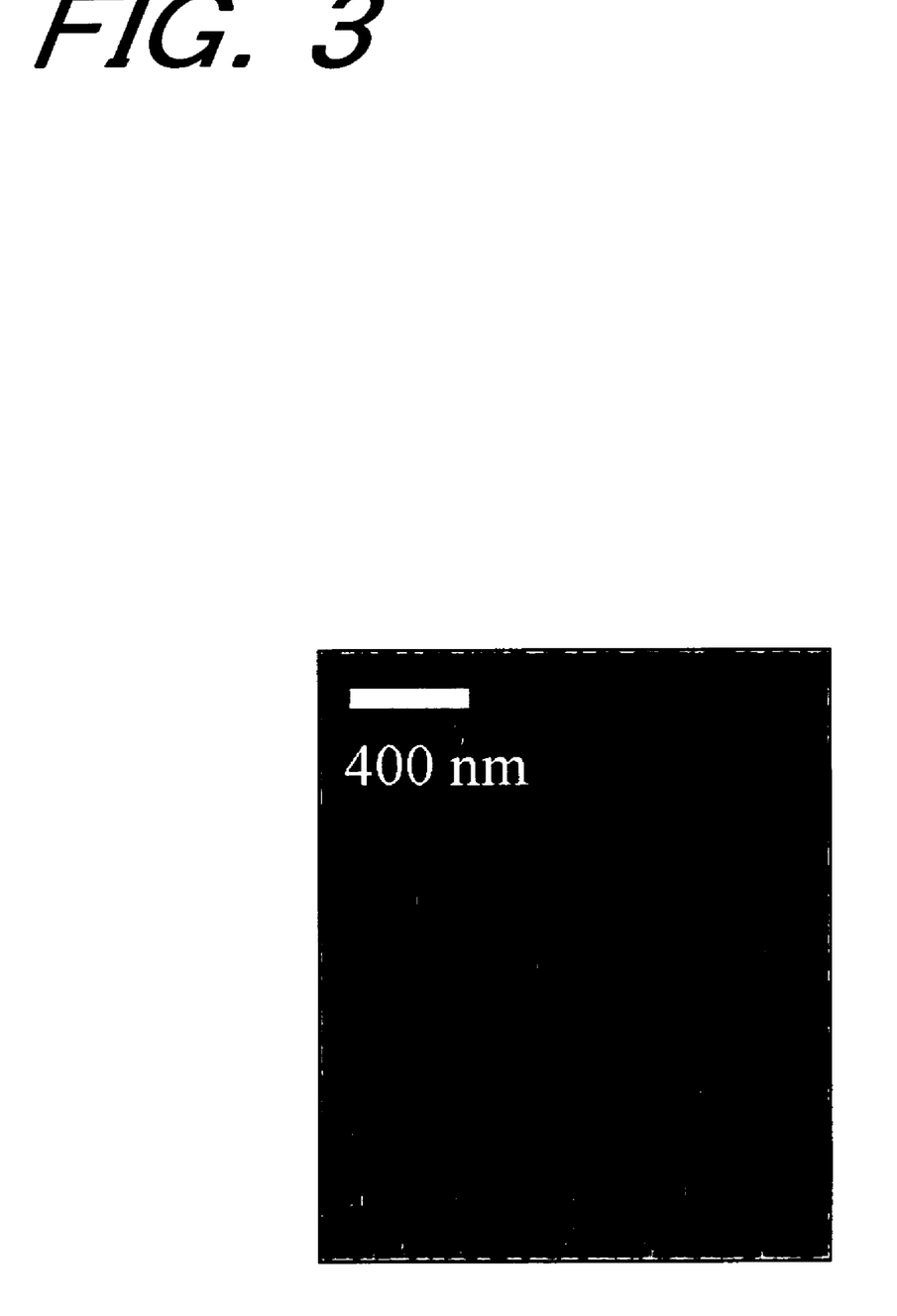
FIG. 3 is an SEM photograph showing experimental results conducted by the inventor of the present application.

FIG. 3 shows an SEM photograph photographed after development thereof wherein a belt-like pattern of 200 nm is not produced by photosensitization of openings A defined between structure components 104, but thin grooves each having around 50 nm width are carved at edges of the respective structure components 104.

Figure 4:
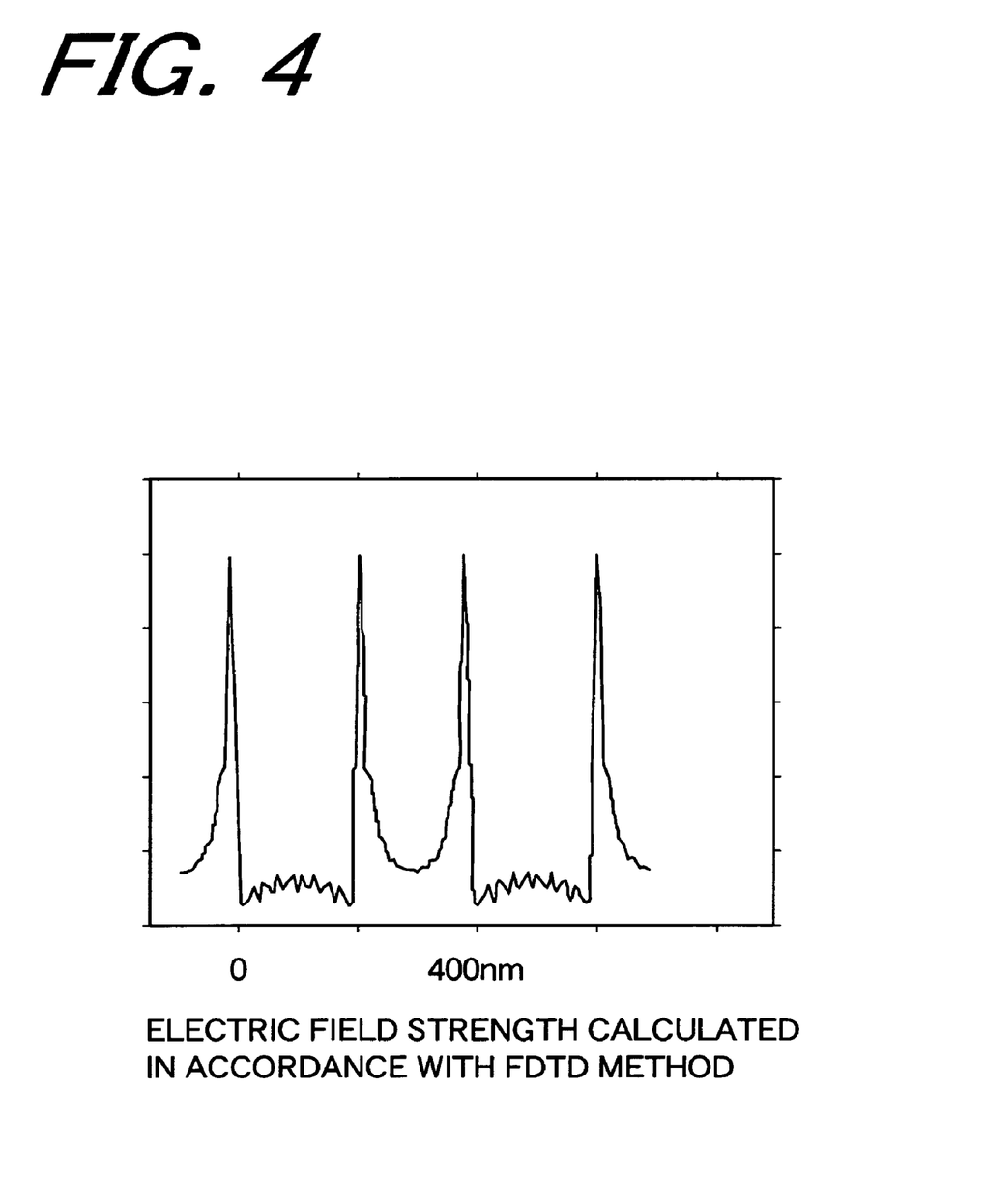
FIG. 4 is a graphical representation indicating resultant values calculated in accordance with finite element time domain method (FDTD method)

In FIG. 4, results obtained by calculating an electric field strength distribution in the lithography mask 100 in accordance with a finite element time domain method are shown.

As is apparent from FIG. 4, a status where the electric field is strikingly intensified at edges of the respective structure components 104 is observed.

Next, simulation results calculated by the inventor of the present application in accordance with an FDTD method will be described by referring to FIG. 5 wherein a lithography mask 200 provided with no substrate 12, in other words, a thickness of the substrate 12 being zero is applied as the lithography mask according to the present invention.

Figure 5:
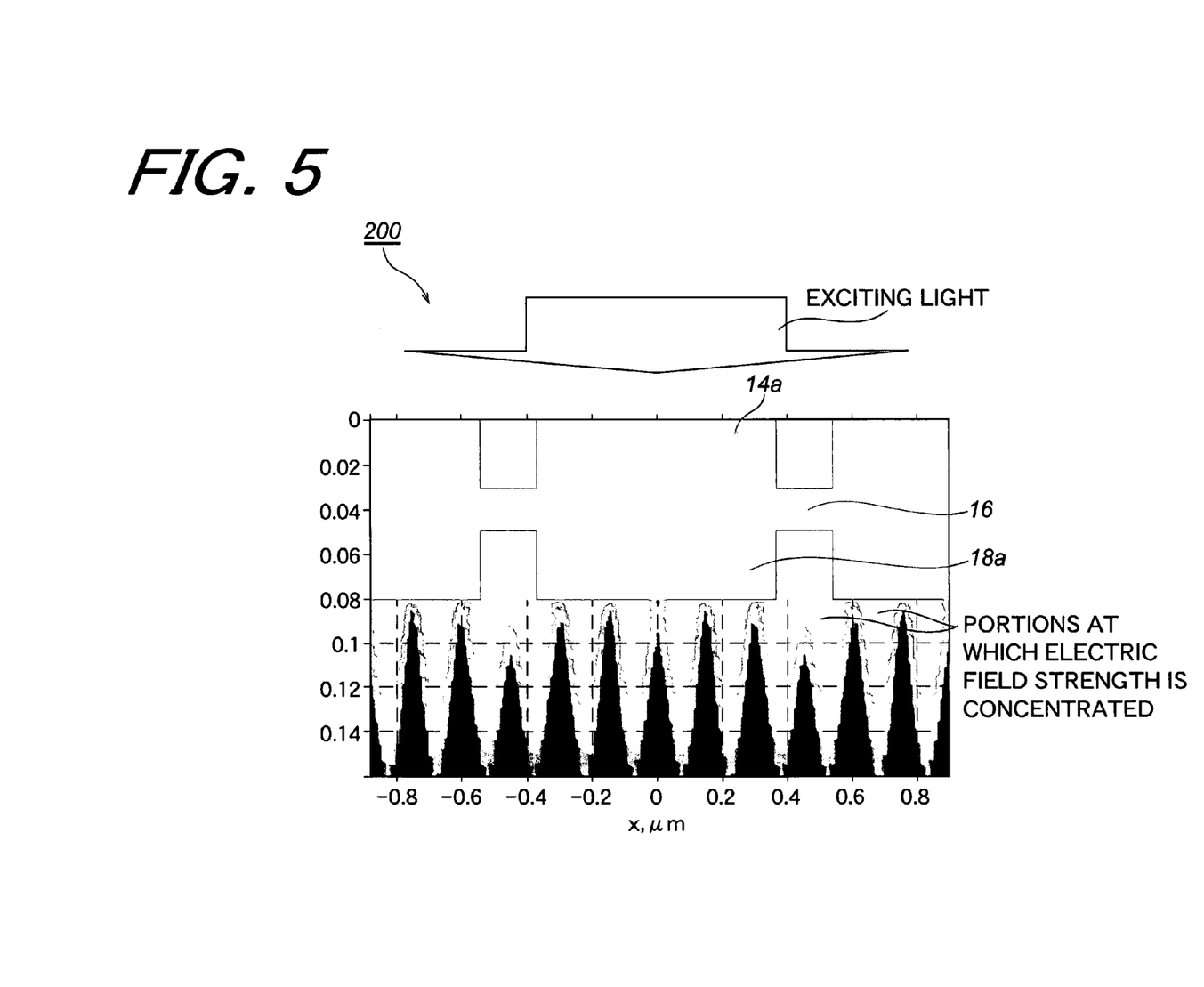
FIG. 5 is an electric field strength distribution map showing simulation results conducted by the inventor of the present application.

Namely, as shown in FIG. 5, a metallic film having a thickness of 20 nm is prepared as an electric field transmission layer 16, and metallic small pieces 14a for making a periodic structure each having 720 nm width and 30 nm thickness are disposed on the upper surface of the metallic film in 900 nm period, while metallic fine protrusion 18a each having 720 nm width and 30 nm thickness are disposed on the lower surface of the metallic film in 900 nm period. Thus, grooves each having 900 nm period, 180 nm width, and 30 nm depth are formed. In this case, Ag is used for the above-described metal.

When exciting light (mercury g-line (436 nm wavelength)) is irradiated on the resulting lithography mask 200 from the upper direction, concentrations of intensified electric field strength (white portions in FIG. 5) are observed at edge portions of the fine protrusions 18a in the fine structure 18 formed on the opposite surface of the metallic film (the lower surface in FIG. 5) and periodic portions excited thereby. In other words, light is captured by the periodic structure 14 formed on either surface (the upper surface in FIG. 5) of the metallic film, an electric field is transmitted through a metallic film having 20 nm thickness served for the electric field transmission layer 16, and the light is redistributed by the fine structure formed on the opposite surface (the lower surface in FIG. 5) of the metallic film.

As a matter of convenience for computation time, although a periodic structure is used as the fine structure 18, such periodic structure is not necessarily required for forming a near field having a high spatial frequency on the opposite surface (the lower surface in FIG. 5) of the metallic film, so that an arbitrary pattern may be fabricated.

Furthermore, it is possible to achieve longer distance for attenuation in a near field dependent upon a design of parameters, so that there is no need for making the lithography mask 200 to be closely in contact with a resist, resulting in very easy positioning of them.

Next, other simulation results calculated by the inventor of the present application in accordance with an FDTD method will be described by referring to FIGS. 6 and 7 wherein a lithography mask 300 (see FIG. 6) and a lithography mask 400 (see FIG. 7) each provided with no substrate 12, in other words, a thickness of the substrate 12 being zero and no electric field transmission layer 16, in other words, a thickness of the electric field transmission layer being zero are applied as the lithography masks according to the present invention, respectively.

Figure 6:
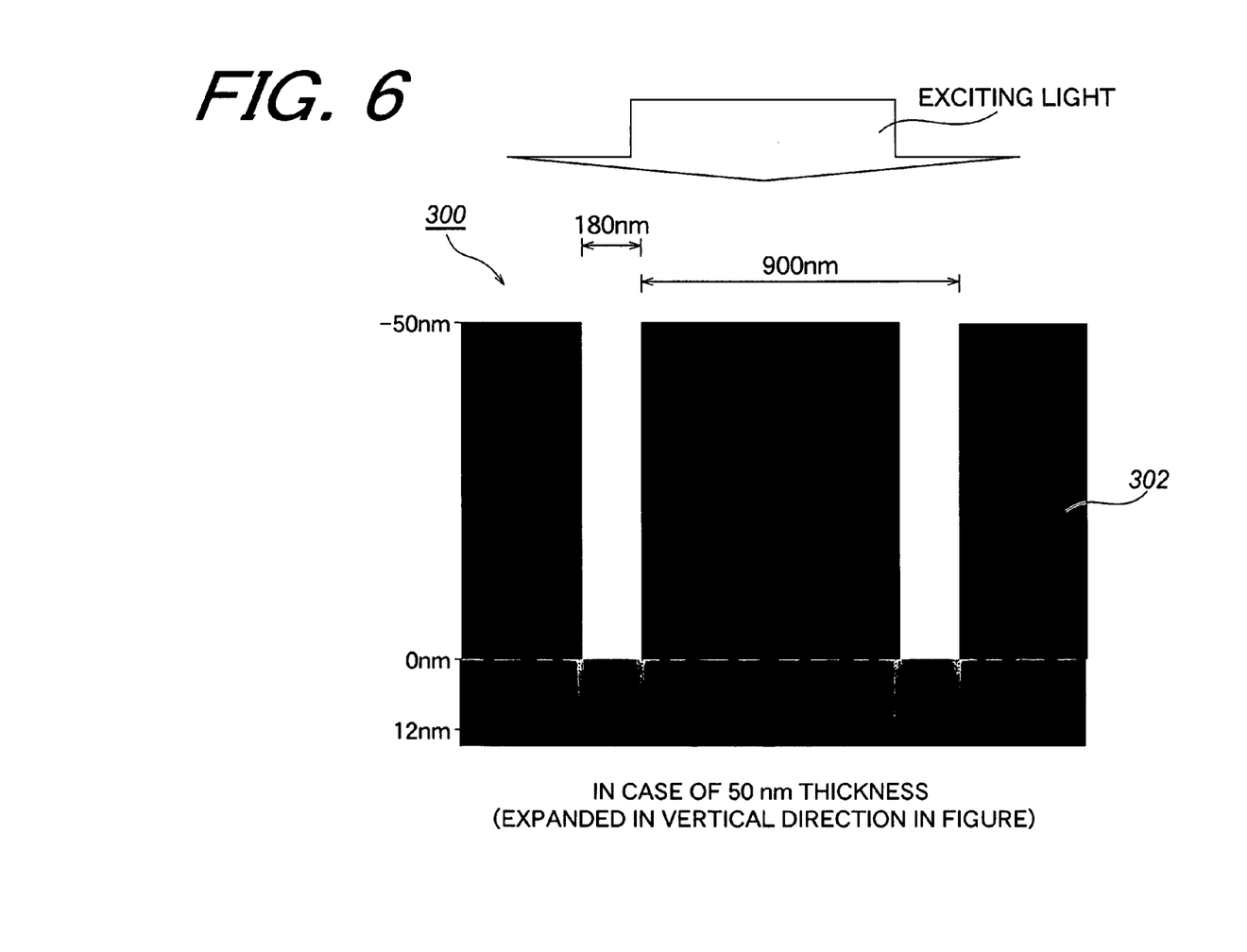
FIG. 6 is another electric field strength distribution map showing simulation results conducted by the inventor of the present application.

Namely, the lithography mask 300, as shown in FIG. 6, being a structure constructing a periodic structure 14 and a fine structure 18 involves a structure component 302 having 720 nm width and 50 nm thickness in 900 nm period. On the other hand, the lithography mask 400, as shown in FIG. 7, being a structure constructing a periodic structure 14 and a fine structure 18 involves a structure component 402 having 720 nm width and 15 nm thickness in 900 nm period.

As described above, the lithography mask 300 differs from the lithography mask 400 in only the thickness of the structure constructing the periodic structure 14 and the fine structure 18, and the other conditions in the lithography mask 300 are the same as that of the lithography mask 400. The structures 302 and 402 are made of Ag, respectively.

When exciting light (mercury g-line (436 nm wavelength)) is irradiated on the resulting lithography mask 300 or 400 from the upper direction, concentrations of intensified electric field strength (white portions in FIG. 6 or 7) are observed at edge portions of the structure 302 or 402 positioned on the opposite surface of the lithography mask 300 or 400 (the lower surface in FIG. 6 or 7) excited thereby as in the case of FIG. 5.

In this event, when a total thickness of the periodic structure 14 and the fine structure 18 or a total thickness of the periodic structure 14, the electric field transmission layer 16, and the fine structure 18 is thinned in the case where no electric field transmission layer 16 is disposed, in other words, a thickness T of the electric field transmission layer is zero, a large wave number is realized as a result of combination of surface and back plasmon, so that a wave number vector in the surface plasmon becomes large. In this event, when the total thickness of the periodic structure 14 and the fine structure 18 or the total thickness of the periodic structure 14, the electric field transmission layer 16, and the fine structure is, for example, around 15 nm as shown in FIG. 7 in the case where no electric field transmission layer 16 is disposed, in other words, a thickness T of the electric field transmission layer is zero, a high spatial resolution is realized, whereby a formation of a fine pattern can be realized.

Figure 7:
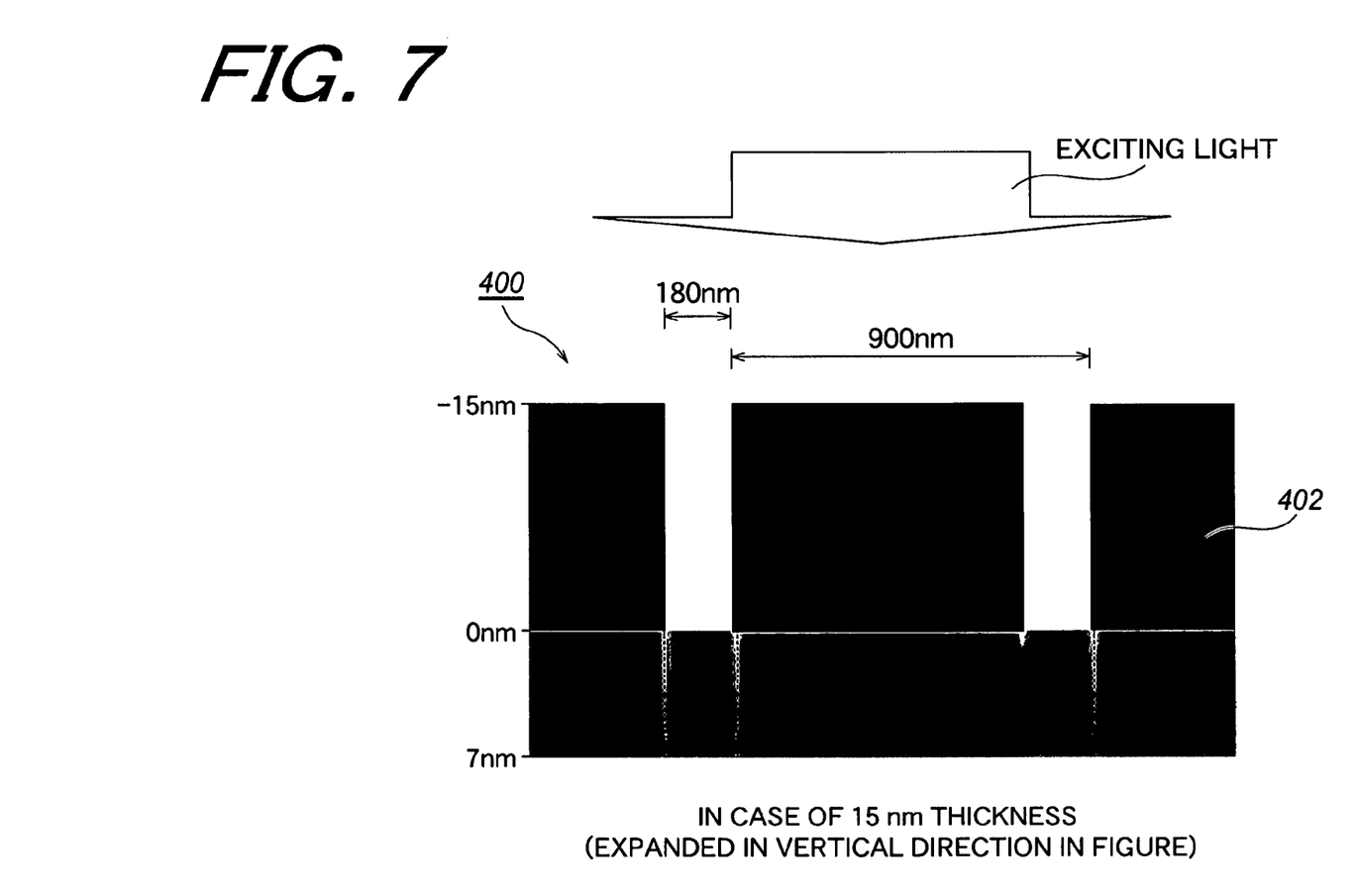
FIG. 7 is still another electric field strength distribution map showing simulation results conducted by the inventor of the present application.

Furthermore, when comparing FIG. 6 with FIG. 7, it is understood that a formation of the finer pattern can be realized in the thinner total thickness of the periodic structure 14 and the fine structure 18 or the thinner total thickness of the periodic structure 14, the electric field transmission layer 16, and the fine structure in the case where no electric field transmission layer 16 is disposed, in other words, a thickness T of the electric field transmission layer is zero.

The above-described preferred embodiment may be modified as described in the following paragraphs (1) through (6).

(1) In the above-described embodiment, although the spatial contour of the recess 12b defined on the surface 12a of the substrate 12 is a quadratic prism shape, the invention is not limited thereto as a matter of course, but the spatial contour of the recess 12b may be defined in an arbitrary shape such as a columnar, a rectangularly columnar, and a hemispherical shape. On the other hand, the small piece 14a for making the periodic structure may also be composed in an arbitrary contour such as a columnar, a rectangularly columnar, and a hemispherical contour in such that the interior of the recess 12 is filled with the small piece 14a without accompanying any clearance.

(2) In the above-described embodiment, although each shape of the fine protrusions 18a formed on the surface 16a of the flat plate-like electric field transmission layer 16 is formed into a quadratic prism shape for constructing the fine structure 18, the invention is not limited thereto as a matter of course, but a contour of the fine protrusion 18a may be shaped into an arbitrary contour such as a columnar, a rectangularly columnar, a hemispherical contour, and a needle-like contour the extreme end of which is sharpened.

In this case, when each contour of the fine protrusions 18a the extreme end of which is sharpened into a needle-like contour, since an electric field strength of near field light oozed from the fine structure 18 becomes the most intensified at each extreme end of the needle-like fine protrusions 18a, a data processing for determining positions of an arrangement for disposing the fine protrusions 18a can be simplified for forming a desired pattern to be transferred to the resist 32.

(3) In the above-described embodiment, although the fine structure 18 is formed by disposing the fine protrusions 18a on the surface 16a of the flat plate-like electric field transmission layer 16, the invention is not limited thereto as a matter of course, but the fine structure may be formed by defining fine recesses on the surface 16a of the flat plate-like electric field transmission layer 16. Furthermore, a spatial contour of such fine recess may be formed in an arbitrary contour such as a columnar, a rectangularly columnar, a hemispherical contour, and a needle-like contour the extreme end of which is sharpened.

(4) In the lithography mask 10 described in the above embodiment, although the electric field transmission layer 16 has a predetermined thickness T, the thickness T of the electric field transmission layer 16 may be zero, in other words, no electric field transmission layer 16 may be provided as shown in FIG. 12.

(5) In the lithography mask 10 described in the above embodiment, although the substrate 12 has a predetermined thickness, the thickness of the substrate 12 may be zero, and in other words, no substrate 12 may be provided as shown in FIG. 5.

(6) The above-described embodiment and the modifications described in the above paragraphs (1) through (5) may be properly combined with each other.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2004-12221 filed on Apr. 16, 2004 including specification, claims, drawings and summary are incorporated herein by reference in its entirety.

What is claimed is:

1. A lithography mask comprising:
a periodic structure for producing surface plasmon resonance by coupling surface plasmon with light; and
a fine structure having a periodically or aperiodically arbitrary shape, the fine structure being formed opposite to the periodic structure,
the periodic structure being located between an input side of the light and the fine structure,
the periodic structure and the fine structure being made from electrically conductive materials.

2. The lithography mask as claimed in claim 1 wherein:
a total thickness of the periodic structure and the fine structure is about 15 nm.

3. A lithography mask comprising:
a periodic structure for producing surface plasmon resonance by coupling surface plasmon with light;
a fine structure having a periodically or aperiodically arbitrary shape, the fine structure being formed opposite to the periodic structure, the periodic structure being located between an input side of the light and the fine structure; and
an electric field transmission layer is formed between the periodic structure and the fine structure, and the fine structure is formed on the electric field transmission layer.

4. The lithography mask as claimed in claim 3 wherein:
a total thickness of the periodic structure, the electric field transmission layer, and the fine structure is about 15 nm.

5. The lithography mask as claimed in any one of claims 3 and 4 wherein:
the periodic structure, the electric field transmission layer, and the fine structure are made from a conductive material.

6. The lithography mask as claimed in any one of claims 2, 3 and 4 wherein:
the fine structure is composed of fine protrusions or fine recesses each having a predetermined shape.

7. The lithography mask as claimed in claim 1 wherein:
the fine structure is composed of fine protrusions or fine recesses each having a predetermined shape.

8. The lithography mask as claimed in claim 5 wherein:
the fine structure is composed of fine protrusions or fine recesses each having a predetermined shape.

9. The lithography mask as claimed in claim 6 wherein:
the fine protrusion or the fine recess has a columnar, a hemispherical, or a rectangularly columnar shape.

10. The lithography mask as claimed in claim 7 wherein:
the fine protrusion or the fine recess has a columnar, a hemispherical, or a rectangularly columnar shape.

11. The lithography mask as claimed in claim 8 wherein:
the fine protrusion or the fine recess has a columnar, a hemispherical, or a rectangularly columnar shape.

12. The lithography mask as claimed in claim 6 wherein:
the fine protrusion or the fine recess has a needle-like shape the extreme end of which is sharpened.

13. The lithography mask as claimed in claim 7 wherein:
the fine protrusion or the fine recess has a needle-like shape the extreme end of which is sharpened.

14. The lithography mask as claimed in claim 8 wherein:
the fine protrusion or the fine recess has a needle-like shape the extreme end of which is sharpened.

15. An optical lithography method using surface plasmon comprising the steps of:
inputting light to the periodic structure in the lithography mask as claimed in any one of claims 2, 3 and 4;
photosensitizing a resist with near field light a strength of which is intensified by surface plasmon resonance oozed from the fine structure; and
transferring a pattern corresponding to the fine structure to the resist.

16. An optical lithography method using surface plasmon comprising the steps of:
inputting light to the periodic structure in the lithography mask as claimed in claim 1;
photosensitizing a resist with near field light a strength of which is intensified by surface plasmon resonance oozed from the fine structure; and
transferring a pattern corresponding to the fine structure to the resist.

17. An optical lithography method using surface plasmon comprising the steps of:
inputting light to the periodic structure in the lithography mask as claimed in claim 5;
photosensitizing a resist with near field light a strength of which is intensified by surface plasmon resonance oozed from the fine structure; and
transferring a pattern corresponding to the fine structure to the resist.

18. An optical lithography method using surface plasmon comprising the steps of:
- inputting light to the periodic structure in the lithography mask as claimed in claim 6;
- photosensitizing a resist with near field light a strength of which is intensified by surface plasmon resonance oozed from the fine structure; and
- transferring a pattern corresponding to the fine structure to the resist.

19. An optical lithography method using surface plasmon comprising the steps of:
- inputting light to the periodic structure in the lithography mask as claimed in claim 7;
- photosensitizing a resist with near field light a strength of which is intensified by surface plasmon resonance oozed from the fine structure; and
- transferring a pattern corresponding to the fine structure to the resist.

20. An optical lithography method using surface plasmon comprising the steps of:
- inputting light to the periodic structure in the lithography mask as claimed in claim 8;
- photosensitizing a resist with near field light a strength of which is intensified by surface plasmon resonance oozed from the fine structure; and
- transferring a pattern corresponding to the fine structure to the resist.

21. An optical lithography method using surface plasmon comprising the steps of:
- inputting light to the periodic structure in the lithography mask as claimed in claim 9;
- photosensitizing a resist with near field light a strength of which is intensified by surface plasmon resonance oozed from the fine structure; and
- transferring a pattern corresponding to the fine structure to the resist.

22. An optical lithography method using surface plasmon comprising the steps of:
- inputting light to the periodic structure in the lithography mask as claimed in claim 10;
- photosensitizing a resist with near field light a strength of which is intensified by surface plasmon resonance oozed from the fine structure; and
- transferring a pattern corresponding to the fine structure to the resist.

23. An optical lithography method using surface plasmon comprising the steps of:
- inputting light to the periodic structure in the lithography mask as claimed in claim 11;
- photosensitizing a resist with near field light a strength of which is intensified by surface plasmon resonance oozed from the fine structure; and
- transferring a pattern corresponding to the fine structure to the resist.

24. An optical lithography method using surface plasmon comprising the steps of:
- inputting light to the periodic structure in the lithography mask as claimed in claim 12;
- photosensitizing a resist with near field light a strength of which is intensified by surface plasmon resonance oozed from the fine structure; and
- transferring a pattern corresponding to the fine structure to the resist.

25. An optical lithography method using surface plasmon comprising the steps of:
- inputting light to the periodic structure in the lithography mask as claimed in claim 13;
- photosensitizing a resist with near field light a strength of which is intensified by surface plasmon resonance oozed from the fine structure; and
- transferring a pattern corresponding to the fine structure to the resist.

26. An optical lithography method using surface plasmon comprising the steps of:
- inputting light to the periodic structure in the lithography mask as claimed in claim 14;
- photosensitizing a resist with near field light a strength of which is intensified by surface plasmon resonance oozed from the fine structure; and
- transferring a pattern corresponding to the fine structure to the resist.

27. The lithography mask as claimed in claim 3, wherein the periodic structure and the fine structure are made from electrically conductive materials.

28. The lithography mask as claimed in claim 1, wherein the periodic structure and fine structure are formed from the same material.

29. The lithography mask as claimed in claim 3, wherein the periodic structure and fine structure are formed from the same material.

* * * * *